(12) United States Patent
Kagan et al.

(10) Patent No.: US 10,593,755 B2
(45) Date of Patent: Mar. 17, 2020

(54) ELECTRONIC COLLOIDAL NANOCRYSTAL DEVICES

(71) Applicants: The Trustees of the University of Pennsylvania, Philadelphia, PA (US); Korea Institute of Geoscience and Mineral Resources, Daejeon (KR)

(72) Inventors: Cherie R. Kagan, Bala Cynwyd, PA (US); Ji-Hyuk Choi, Daejeon (KR); Han Wang, Philadelphia, PA (US); Soong Ju Oh, Seoul (KR)

(73) Assignees: The Trustees of the University of Pennsylvania, Philadelphia, PA (US); Korea Institute of Geoscience and Mineral Resources, Daejeon (KR)

( * ) Notice: Subject to any disclaimer, the term of this patent is extended or adjusted under 35 U.S.C. 154(b) by 0 days.

(21) Appl. No.: 16/091,119

(22) PCT Filed: Apr. 6, 2017

(86) PCT No.: PCT/US2017/026366
§ 371 (c)(1),
(2) Date: Oct. 4, 2018

(87) PCT Pub. No.: WO2018/004770
PCT Pub. Date: Jan. 4, 2018

(65) Prior Publication Data
US 2019/0131393 A1    May 2, 2019

Related U.S. Application Data

(60) Provisional application No. 62/319,395, filed on Apr. 7, 2016.

(51) Int. Cl.
*H01L 21/02* (2006.01)
*H01L 29/06* (2006.01)
(Continued)

(52) U.S. Cl.
CPC .... *H01L 29/0665* (2013.01); *H01L 21/02554* (2013.01); *H01L 21/02573* (2013.01);
(Continued)

(58) Field of Classification Search
CPC ......... H01L 21/02365; H01L 21/02518; H01L 29/66007; H01L 29/68
See application file for complete search history.

(56) References Cited

U.S. PATENT DOCUMENTS 7,402,506 B2   7/2008  Levy et al.
9,865,465 B2   1/2018  Kagan et al.
(Continued)

OTHER PUBLICATIONS

International Search Report and Written Opinion for International Application No. PCT/US2017/026366, dated Jan. 4, 2018—8 pages.
(Continued)

*Primary Examiner* — Cheung Lee
(74) *Attorney, Agent, or Firm* — BakerHostetler

(57) ABSTRACT

Colloidal nanocrystal electronic devices including multiple types of nanocrystal device elements including nanocrystal metallic electrodes, nanocrystal insulators, and nanocrystal insulators. Colloidal nanocrystal electronic devices may be produced by forming multiple nanocrystal electronic device elements on a substrate.

12 Claims, 4 Drawing Sheets

(51) Int. Cl.
*H01L 29/43* (2006.01)
*H01L 29/786* (2006.01)
*C23C 14/08* (2006.01)

(52) U.S. Cl.
CPC .. *H01L 21/02601* (2013.01); *H01L 21/02628* (2013.01); *H01L 29/43* (2013.01); *H01L 29/7869* (2013.01); *H01L 29/78681* (2013.01); *C23C 14/08* (2013.01)

(56) References Cited

U.S. PATENT DOCUMENTS

| | | |
|---|---|---|
| 2013/0009111 A1 | 1/2013 | Morita et al. |
| 2015/0076488 A1 | 3/2015 | Kishi et al. |
| 2015/0076648 A1 | 3/2015 | Yang |

OTHER PUBLICATIONS

Talapin et al., "Prospects of Colloidal Nanocrystals for Electronic and Optoelectronic Applications", Chem. Rev. 2010, vol. 110—pp. 389-458.

Woodward, E., "Low Temperature Dopant Activation for Applications in Thin Film Silicon Devices", Rochester Institute of Technology, RIT Scholar Works, May 22, 2006, Thesis/Dissertation Collections, http://scholarworks.rit.edu/theses—138 pages.

International Preliminary Report on Patentability for International Application No. PCT/US2017/026366, dated Oct. 9, 2018, 8 pages.

Talapin et al. "Prospects of Colloidal Nanocrystals for Electronic and Optoelectronic Applications" Chem. Rev. 2010, vol. 110, 389-458.

ELECTRONIC COLLOIDAL NANOCRYSTAL DEVICES

CROSS REFERENCE TO RELATED APPLICATIONS

This application is a U.S. National Phase filing of International Application PCT/US2017/026366, filed Apr. 6, 2017, and claims priority from U.S. Provisional Patent Application Ser. No. 62/319,395, filed Apr. 7, 2016, the contents of which are incorporated herein by reference in their entirety.

GOVERNMENT RIGHTS

This invention was made with government support under grant numbers DMR1120901 awarded by the National Science Foundation and DE-SC0002158 awarded by the Department of Energy. The government has certain rights in the invention.

BACKGROUND OF THE INVENTION

Electronics are increasingly pervasive as new applications in mobile, wearable, and implantable devices for communication, computation, and sensing are introduced. Many of these applications require high-mobility, low-cost, large-area, and flexible semiconductor devices that require new fabrication processes to meet the demand.

Colloidal, inorganic nanocrystals (NCs) are a promising class of materials for use in electronics. NCs are typically only used to form a single element in electronic devices, however, with the remainder of the device architecture realized with characteristically costly and slow, conventional vacuum-based deposition methods. Unlike conventional microelectronics, protocols for the integration of multiple, dissimilar, NC materials to construct high-performance devices do not exist. Integration is a challenging feat and requires the development of processes that do not detrimentally alter NC surface chemistry and that allow the complex stacking and patterning of NC thin films, and at the same time the design of chemically compatible, structurally stable, and physically cooperative materials and interfaces to achieve suitable device function.

SUMMARY OF THE INVENTION

Aspects of the invention are directed to colloidal nanocrystal electronic devices such as field effect transistors including multiple types of nanocrystal device elements, e.g., nanocrystal metallic electrodes, nanocrystal insulators, and/or nanocrystal insulators.

Other aspects of the invention are directed to producing colloidal nanocrystal electronic devices. Colloidal nanocrystal electronic devices may be produced by forming a first colloidal nanocrystal electronic device element of a first type on a substrate, forming a second colloidal nanocrystal electronic device element of a second type on the first colloidal nanocrystal electronic device element, and forming a third colloidal nanocrystal electronic device element of a third type on the second colloidal nanocrystal electronic device element. Each colloidal nanocrystal electronic device element may be selected and formed in accordance with multiple geometries in order to form a desired electronic device. For example, the first colloidal nanocrystal electronic device element may be a metallic electrode, the second colloidal nanocrystal electronic device element may be an insulator, and the third colloidal nanocrystal electronic device element may be a semiconductor. In another example, the first colloidal nanocrystal electronic device element may be a semiconductor, the second colloidal nanocrystal electronic device element may be an insulator, and the third colloidal nanocrystal electronic device element may be a metallic electrode.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

In accordance with aspects of the present invention, metallic, semiconducting, and insulating NCs are integrated and the materials, interfaces, and processes are designed to enable the construction of all the components of high-performance, solution-processable, and flexible electronic devices such as a field-effect transistor (FETs) using colloidal NCs. In one embodiment, organic phase dispersions of Ag NCs, aqueous dispersions of $Al_2O_3$ NCs, and organic phase dispersions of CdSe NCs are selected for their properties and orthogonal processing to form and stack the gate electrode, gate insulator, and semiconducting channel layers of a FET, respectively. Indium (In) in the form of colloidal NCs is introduced and the In NCs are codispersed with Ag NCs to create a solution-processable NC ink used to construct the source and drain electrodes and to supply atomic In upon annealing that passivates and dopes the NC semiconducting channel. Thus, a base colloidal NC layer may be formed first and an adjacent layer of colloidal NCs may be used as a supply of dopant to the base colloidal NC layer to form a final NC semiconducting channel. Surface exchange of the Ag and CdSe NCs with the compact ligand thiocyanate (SCN) is used to create high-conductivity electrodes and high-mobility semiconductor channel layers, and to allow stacking of NC device layers. Additional details regarding surface exchange can be found in U.S. patent application Ser. No. 14/761,799, which is incorporated fully herein by reference.

Ag, $Al_2O_3$, and CdSe NC thin film surfaces are modified with polyelectrolytes to control surface charge and passivation and to exploit their high dielectric constants, to engineer chemically compatible, structurally stable, and physically cooperative device layers. By designing the constituent materials, interfaces, and processes, different NC building blocks can be integrated using solution-based processes to realize high-performance and flexible electronic devices, rivaling the high-mobility, low-hysteresis, and low-voltage operation of previously reported FETs fabricated from only a single-semiconductor NC layer, but otherwise constructed using conventional processes.

Figure 1:
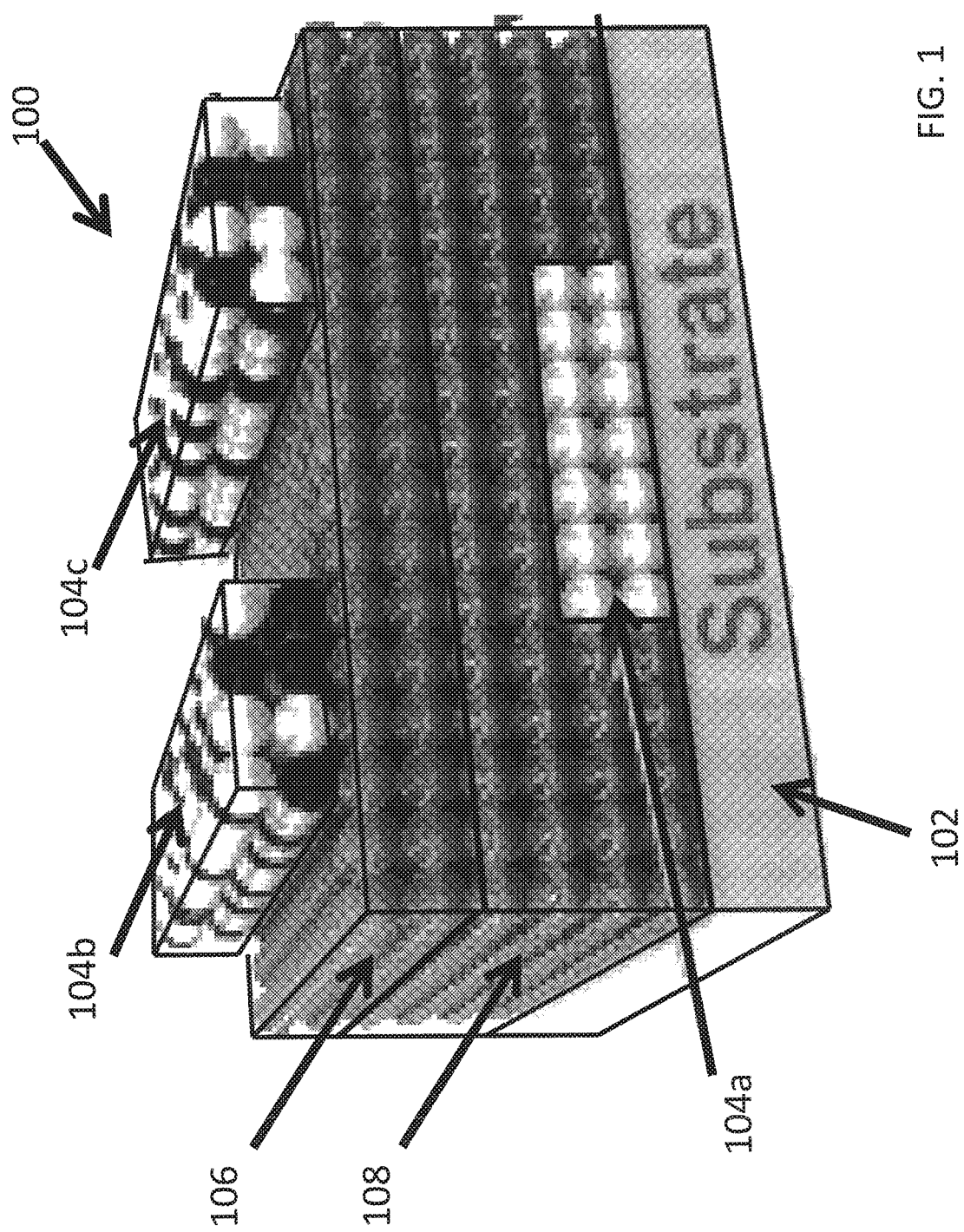
FIG. 1 is an illustration depicting a colloidal nanocrystal electronic device in accordance with aspects of the invention.

FIG. 1 depicts an electronic device 100 formed on a substrate 102 in accordance with one embodiment of the invention where all elements of the electronic device 100 are formed from nanocrystals. The electronic device 100 includes a colloidal nanocrystal gate electrode 104a, a colloidal nanocrystal insulator 108 covering the colloidal nanocrystal gate, a colloidal nanocrystal semiconductor 106 formed on the insulator 108, a colloidal nanocrystal source electrode 104b formed on the colloidal nanocrystal semiconductor 106 in a first area, and a colloidal nanocrystal drain electrode 104c formed on the colloidal nanocrystal semiconductor 106 in a second area. Thus, the electronic device 100 is made up of multiple layers of colloidal nanocrystal electronic device elements of different types (i.e., metallic electrodes, insulators, and semiconductors). Although the illustrated electronic device 100 is a bottom gate and top contact (source and drain) FET, other types of electronic devices such as a transistor with a top gate and top contact or a device with a bottom contact and top gate having 1) metal, 2) semiconductor, 3) insulator, 4) metal. Various other electronic devices and their configuration will be understood by one of skill in the art from the description herein.

FIGS. 2A-F illustrate a process flow for integrating NCs to fabricate an all-NC FET in accordance with one embodiment of the invention. To facilitate description, the process flow will be described with reference to the electronic device 100 of FIG. 1. Although one FET is depicted, the process may be used to simultaneously make many electronic devices including FETs and other types of electronic devices.

Figure 2B:
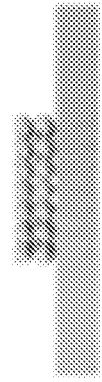
FIGS. 2A, 2B, 2C, 2D, 2E, 2F are illustrations depicting the process flow for producing a colloidal nanocrystal electronic device in accordance with aspects of the invention.
Figure 2D:
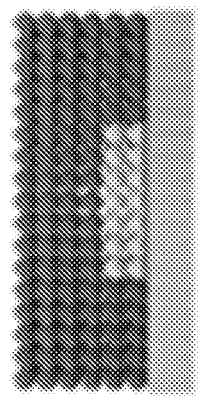
Figure 2F:
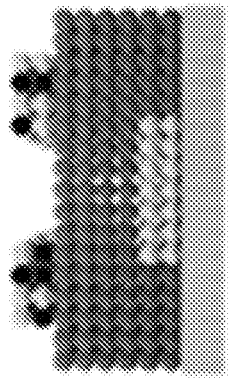
Figure 2A:
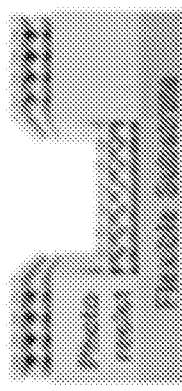
Figure 2C:
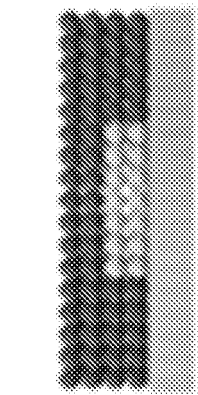

As depicted in FIG. 2A, an Ag NC bottom gate electrode 104a is formed by lithographically patterning photoresist on a flexible Kapton substrate 102 and then twice spin-coating a Ag NC dispersion (40 mg/ml) and immersing the Ag NC-coated substrate in a 1% NH4SCN methanolic solution to exchange the native capping ligand.

As depicted in FIG. 2B, the resist is lifted off, yielding patterned, Ag NC gate electrodes 104a that are 80±10 nm in thickness. The Ag NC gate electrode 104a surface is treated with polyelectrolytes poly(dimethyldiallyl ammoniumchloride) (PDDA) and poly(styrenesulfonate) (PSS) and then $Al_2O_3$ NCs are deposited to form the gate insulator layer 108. Modification of the Ag NC gate electrode surface with the negatively charged PSS electrostatically enhances the adsorption of the positively charged $Al_2O_3$ NCs and assists in assembling uniform $Al_2O_3$ NC layers. Subsequently, PSS and $Al_2O_3$ NCs are deposited layer by layer (LBL) by spin coating to construct the gate insulator layer. The positively charged $Al_2O_3$ NC surface is modified with negatively charged PSS to grow the gate insulator layer 108. To form low-leakage FETs, a gate insulator layer of ~80 nm is prepared by depositing three layers of a $Al_2O_3$ NC dispersion (25 mg/ml) alternately with PSS. The gate insulator layer 108 is cured at 100° C. for 30 min in air to remove residual solvent.

The organic ligands used to synthesize CdSe NCs are exchanged with compact $SCN^-$ ligands. SCN-exchanged CdSe NC dispersions (25 mg/ml) are spin-cast onto the $Al_2O_3$ NC gate insulator layer 108 to form 60±5 nm thick films as the semiconductor layer 106 as depicted in FIG. 2D.

Before depositing the source electrode 104b and the drain electrode 104c, the CdSe NC layer is passivated to prevent delamination during subsequent photolithographic patterning. Solution-based deposition of a PDDA/PSS bilayer successfully prevents delamination. Structural, optical, electrochemical, and electrical characterization of the CdSe NC layer after the PDDA/PSS surface treatment shows that the treatment has little effect on the CdSe NC film, and analytical measurements show that surface $SCN^-$ ligands are displaced by $Cl^-$ introduced in the PDDA. Surface halogenation in IV-VI NCs is known to passivate NC films electronically and to stabilize NC films toward processing in air. Surface halogenation through the PDDA/PSS treatment stabilizes the CdSe NC films in the "harsh" chemical environments of solution-based device integration.

Figure 2E:
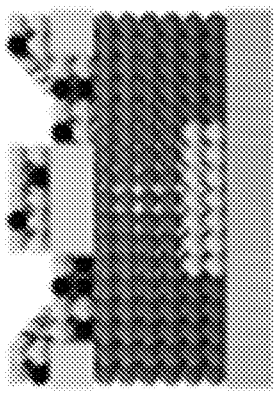

Finally, 100±10 nm thick source and drain electrodes 104b/c are patterned atop the CdSe NC layer 106, and the surface ligands are exchanged by immersion in a solution of $NH_4SCN$, following the same procedure used to define the gate electrode layer 104a. As depicted in FIG. 2E, photolithographic patterning and Ag NC/In NC spincoating are performed. The photoresist is then lifted off to yield the source and drain electrodes 104b/c as depicted in FIG. 2F. A codispersion of Ag NCs and In NCs may be used to provide an In supply for doping and passivating the CdSe NC channel 106. The fabricated devices are then thermally annealed at 250° C. for 10 min in a nitrogen glovebox to densify the CdSe NC film 106 and activate In diffusion from the colloidal NCs introduced in the source and drain electrodes 104b/c.

Figure 3C:
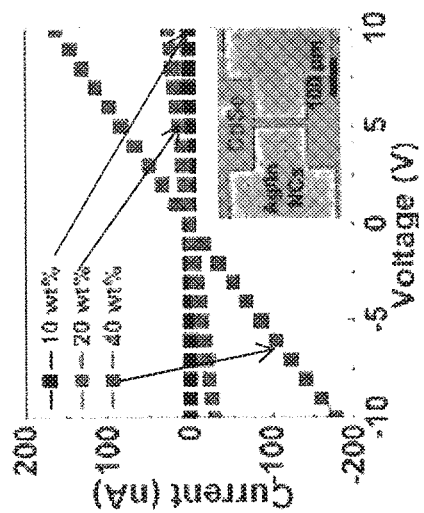
FIG. 3C is a graph depicting current-voltage characteristics of CdSe NC films with patterned Ag/In NC electrodes as a function of the In NC concentration.
Figure 3B:
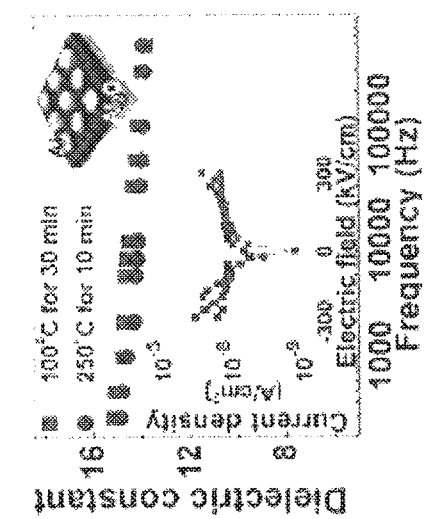
FIG. 3B is a graph depicting frequency dependent dielectric constant for a $Al_2O_3$ NC dielectric layer and (inset bottom) the leakage current density as a function of electric field.
Figure 3A:
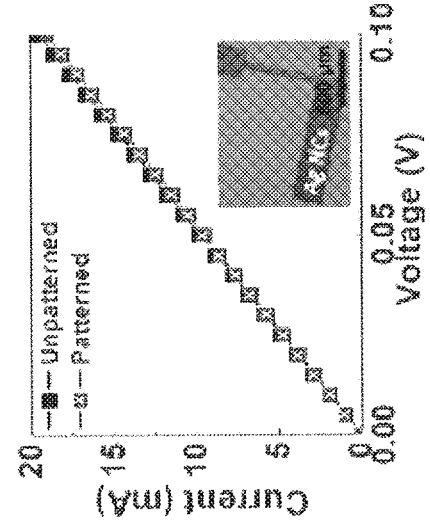
FIG. 3A is a graph depicting two-point resistivity measurements of patterned and unpatterned Ag NC films.

To confirm the function of each NC component (electronic device element) contributing to the integrated device performance, their structural and electrical properties were examined. The SCN-exchanged, Ag NC films are robust to immersion in the solvents used in photolithography, allowing the patterning of well-defined Ag NC electrodes (FIG. 3A, inset). The patterned ~80-nm Ag NC films are uniform and crackfree, with a root mean square (RMS) roughness of ~7 nm and a conductivity s of $2.45 \times 10^3$ S/cm, similar to that of unpatterned Ag NC films ($2.84 \times 10^3$ S/cm) (FIG. 3A). Annealing the Ag NC electrodes to 250° C., corresponding to the temperature seen in complete device fabrication, increases the conductivity to $2.38 \times 10^4$ S/cm, akin to that of vapor-deposited silver films.

The $Al_2O_3$ NC insulator layer 108 prepared by layer-by-layer (LBL) assembly are continuous and smooth. The film thickness increases linearly and the RMS roughness increases marginally as the number of spin-coating cycles is increased from 1 to 10. The frequency dependence of the dielectric constant of the $Al_2O_3$ NC insulator layers is probed in a metal-insulator-metal configuration by capacitance-voltage measurements (FIG. 3B). The dielectric constant is ~15.1 at 50 Hz and shows <5% dispersion between 50 and $10^6$ Hz for the 100° C., 30-min annealed $Al_2O_3$ NC layer, which is larger than the ~8 dielectric constant typical of $Al_2O_3$ layers grown by ALD, sputtering, and anodization. The increased dielectric constant is consistent with the incorporation of PSS, which has a high dielectric constant of ~30 to 120. Upon further annealing of the films at 250° C. for 10 min to mimic the thermal processing seen in device fabrication, the dielectric constant is marginally smaller (~14.9), implying that the intervening PSS still contributes to the properties of the gate insulator layer in the completed FET. The increased dielectric constant of the $Al_2O_3$ NC insulator layer by the PSS allows more efficient charge accumulation in the semiconducting channel for low-voltage FET operation. The leakage current densities (FIG. 3B, inset) are ~$7.16 \times 10^{-7}$ $A/cm^2$ and ~$2.2 \times 10^{-7}$ $A/cm^2$ at an applied electric field of 300 kV/cm for 80-nm films annealed at 100° C. for 30 min and further annealed at 250° C. for 10 min, respectively. The thin, yet low-leakage and high-dielectric constant $Al_2O_3$ NC-based gate insulator layers enable low-voltage and high-performance, flexible NC electronics.

To form high-mobility CdSe NC FETs, colloidal In NCs are introduced into the Ag NC dispersion used to form the source and drain electrodes as a solution-based, NC route to provide the supply of atomic In upon thermal annealing. Time-of-flight secondary ion mass spectrometry may be used to monitor the lateral and depth profile of In in and across the FET channel. Before annealing, no In is observed in the channel; however, after annealing, In is found uniformly distributed in the FET channel. The electrical characteristics of CdSe NC layers patterned with In NC-containing electrodes and annealed at 250° C. for 10 min (FIG. 3C) have ohmic behavior at low voltages with conductivities that increase from ~$10^{-7}$ S/cm for 0 weight % (wt %) In NCs to ~$2.7 \times 10^{-4}$ S/cm at 40 wt % of In NCs. By controlling the concentration of colloidal In NCs mixed with Ag NCs to form the source and drain electrodes, the doping level of the CdSe NC channel can be designed.

Figures 4A, 4B, 4C:
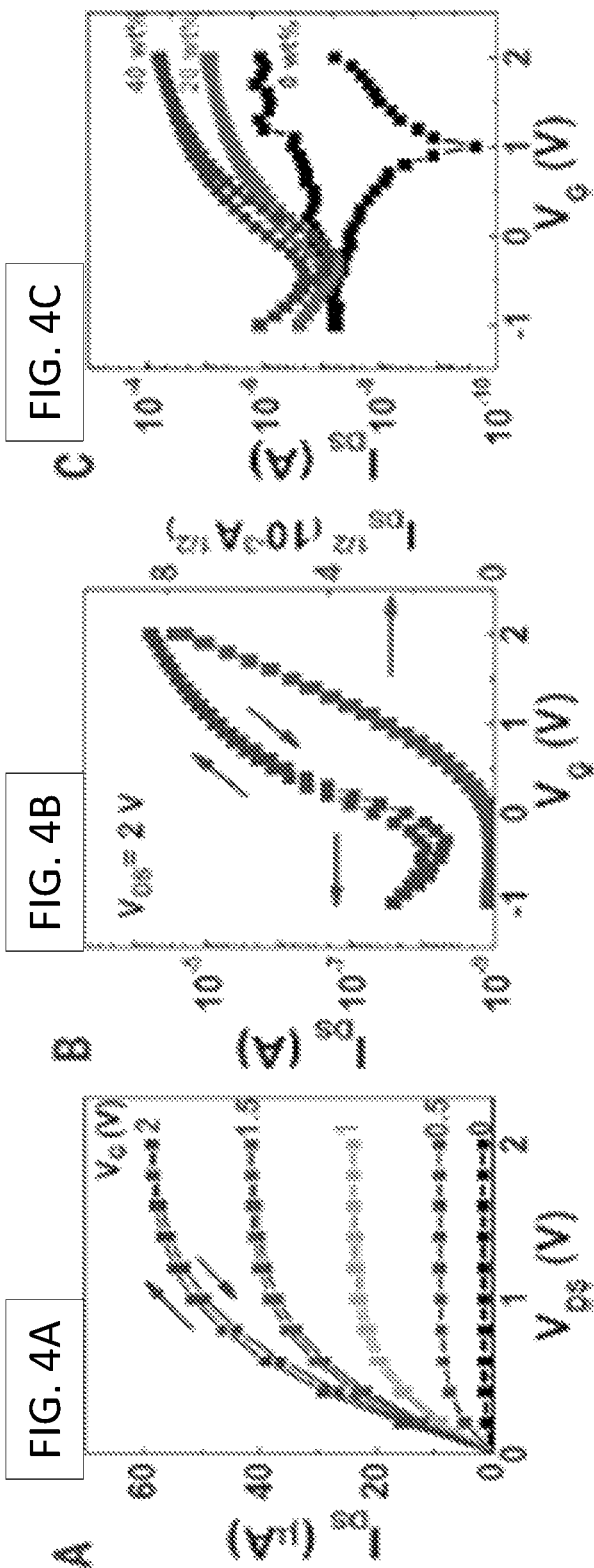
FIG. 4A is a graph depicting output characteristics of an all-NC FET (channel length L=30 µm, width W=450 µm)
FIG. 4B is a graph depicting transfer characteristics of an all-NC FET (channel length L=30 µm, width W=450 µm)
FIG. 4C is a graph depicting transfer characteristics of an all-NC FET fabricated with 0, 20, and 40 wt % In NCs in the source and drain electrodes.

The metallic, semiconducting, and insulating NCs may be integrated to construct all-inorganic NC FETs, as depicted in the schematic in FIG. 1. FIGS. 4A and 4B show representative output and transfer characteristics of an all-NC, solution-processed, flexible FETs in accordance with aspects of the invention fabricated from 40 wt % In NCs mixed in the Ag NC source and drain electrodes, a SCN-exchanged CdSe NC semiconducting channel, an $Al_2O_3$ NC gate insulator layer, and a Ag NC gate electrode. The devices operate at low voltages and exhibit well-behaved n-type FET characteristics in the linear and saturation regimes (FIG. 4A) with an average electron mobility of $\mu=21.7\pm4.5$ $cm^2/V-s$, a threshold voltage $\Delta V_T=0.36\pm0.21$ V, and a subthreshold swing $S=0.31\pm0.05$ V/decade, characterized from four independently prepared devices. The FETs show low hysteresis, as characterized by $\Delta V_T=0.21\pm0.06$ V at $V_{DS}=2$ V. The low-voltage and low-hysteresis FET operation is attributed to the high capacitance (0.176 $mF/cm^2$) of the $Al_2O_3$ NC insulator layer and the low-interface trap density at the $Al_2O_3$ NC/CdSe NC interface. The transfer characteristics of all-NC FETs fabricated with lower concentrations of 0 and 20 wt % In NCs in the Ag NC source and drain electrodes show lower on currents and current modulations (FIG. 4C), consistent with their low doping levels. Increasing the In NC concentration to 40 wt % in the Ag NC-based source and drain electrodes increases the on-current and current modulation to realize all-solution-processed CdSe NC FETs with a high performance similar to that of other state-of-the-art NC FETs fabricated by vacuum based deposition of the electrodes and gate insulator layer.

The high performance of all-NC FETs demonstrates the competitive advantage of colloidal NC materials for large-area, low-cost, and flexible electronics, eliminating the need for conventional vacuum-processed materials and setting the stage to exploit colloidal NC materials for additive manufacturing of devices. The materials integration and fabrication processes described herein may be applied more broadly to the construction of NC-based electronic, optoelectronic, and thermoelectric devices from a wide range of size, shape, and compositionally designed colloidal NC building blocks.

In accordance with aspects of the invention, one or more of the following material preparation and/or assembly methods may be employed.

Ag, CdSe, and In Nanocrystal (NC) synthesis:

10 nm diameter Ag NCs may be synthesized in a conventional manner. Typically, 1 mmol of tetradecylphosphonic acid (PCI synthesis), 2 mmol of silver acetate (Aldrich), and 20 mL of trioctylamine (Aldrich) are loaded into a 50 mL round-bottom flask. Under a nitrogen atmosphere and vigorous stirring, the reaction mixture is heated by microwave irradiation (150 W) to 150° C. in 4 min and held at 150° C. for another 5 min. After synthesis all subsequent steps may be carried out in ambient air conditions. To purify the product, the NCs may be flocculated by adding ethanol and isolated by centrifugation. NCs are subsequently dispersed in hexane, flocculated a second time using isopropyl alcohol, and isolated by centrifugation to ensure the complete removal of excess tetradecylphosphonic acid and trioctylamine. The NCs may then be dispersed in octane for spin-coating.

3.9 nm diameter CdSe NCs may be synthesized through modification of conventional procures. 20 g trioctylphosphine oxide (TOPO, Aldrich), 20 g octadecylamine (Aldrich) and 2.10 g cadmium stearate (Aldrich) may be held under vacuum for 1 h at 120° C., heated to 320° C. under nitrogen, and then 10.0 mL of 1.25 M selenium (Aldrich) in tributylphosphine may be injected to nuceate the NCs. NC growth is continued at 290° C. for 15 min. The reaction is cooled to ~150° C. and transferred air-free into a nitrogen glovebox. The NCs are precipitated with methanol and redispersed in hexanes. The hexanes dispersion is centrifuged to remove insoluble octadecylamine and decanted into a new centrifuge tube. Subsequently, the NCs are precipitated with ethanol. Further washing is done by dispersion/precipitation with hexanes/ethanol, hexanes/acetone, and hexanes/isopropanol. The NCs are then dispersed in hexanes and passed through a 0.2 μm polytetrafluoroethylene (PTFE) filter.

To prepare In NCs, the precursors $Li[N(SiMe_3)_2]_3$ and $In[N(SiMe_3)_2]_3$ are initially synthesized using conventional procedures. For $Li[N(SiMe_3)_2]_3$, 50.24 mL of 1.6 M n-butylithium in hexane (Acros) is loaded into a Schlenk flask under nitrogen and immersed in an ice bath. Then 16.92 mL of 1,1,1,3,3,3-hexamethyldisilazane (Acros) is injected into the flask. The reaction is continued for 1 h and then the solvent is evaporated by placing the Schlenk tube under vacuum to yield $Li[N(SiMe_3)_2]_3$ powder. For $In[N(SiMe_3)_2]_3$, 1.46 g of $InCl_3$ is dissolved in 80 mL of diethylether and loaded into a Schlenk flask under nitrogen. Then 3.35 g of $Li[N(SiMe_3)_2]_3$ dissolved in 40 mL of diethylether is injected into the Schlenk flask and the temperature of the reaction is raised to 60° C. LiCl, a white precipitate, will form during the synthesis. After 24 h of continuous stirring, the reaction is stopped and the solution is passed through a 0.2 µm PTFE filter. The filtered solution (pale-yellow) is placed under vacuum to obtain $In[N(SiMe_3)_2]_3$ powder.

20 nm In NCs may be synthesized through modification of conventional procures. 20 g of hexadeclyamine (Technical grade, Acros) is held under vacuum for 1 h at 105° C. and then heated to 200° C. under nitrogen. 0.26 g of $In[N(SiMe_3)_2]_3$ and 0.728 g of $Li[N(SiMe_3)_2]$ are added to 8 mL of toluene (Acros) and injected into the reaction flask. 1 min later, 0.1 mL of a 1.0 M tetrahydrofuran (THF) solution of $Li[Et_3BH]$ is injected into the flask. The reaction temperature is dropped to and held at 155° C. for 10 min to allow for NC growth. A water bath is used to quench the reaction and 20 mL of toluene is injected to the reaction flask. The In NCs are brought into the nitrogen glovebox and precipitated by ethanol. The In NCs are then redispersed and precipitated by tetrachloroethylene (Aldrich), oleic acid (Aldrich) and ethanol for further washing. Finally, In NCs are dispersed in octane.

$Al_2O_3$ NCs:

Colloidal, approximately 10 nm, gamma-phase, $Al_2O_3$ nanocrystals dispersed in water can be obtained from US Research Nanomaterials.

NC Ligand Exchange and Deposition:

40 mg/mL of Ag NC dispersions in octane are filtered through a 0.2 µm PTFE filter and spin-cast at 1000 rpm for 60 s onto 50 mm thick, preshrunk, $Al_2O_3$-encapsulated polyimide substrates for AFM, conductivity, and transistor measurements. The preshrinking process by encapsulation with $Al_2O_3$ prevent the polyimide substrate from deformation during subsequent thermal treatments, which may otherwise cause delamination and cracking of the deposited NC thin films. The Ag NC coated substrate is immersed in a 1% $NH_4SCN$ (Acros) solution in methanol for 3-5 min to exchange the native tetradecylphosphonic acid and trioctylamine capping ligands. Nonspecifically bound thiocyanate ligand is removed by immersing the sample in pure methanol and drying it in air. Spin-coating, ligand exchange, and washing are repeated twice to form 70-100 nm thick films and to increase film conductivity.

A co-dispersion of Ag NCs and In NCs in octane are filtered through a 0.2 µm PTFE filter and spin-cast at 1000 rpm for 60 s onto CdSe NC films. The concentration of Ag NCs is fixed at 40 mg/mL. The concentration of In NC varies from 0 wt % to 40 wt % 4 in a mixture of Ag NCs and In NCs. The process for ligand exchange and deposition of the Ag/In NC film may be carried out according to the same process as that for the Ag NCs.

In an embodiment, ligand exchange of CdSe NCs is carried out as follows. 2.0 mL of as-synthesized TOPO-capped CdSe NCs dispersed in hexane is mixed with 1.0 mL of $NH_4SCN$ in acetone, at a concentration ranging between 100 to 250 mM. The mixture is stirred by vortexing at 3000 rpm for 2 min, leading to complete precipitation of the CdSe NCs. The slurry is centrifuged at 3000 g for 1 min and then the colorless supernatant is discarded. To wash excess organic ligands, the CdSe NC pellet is redissolved in 2.0 mL of THF, the slurry is stirred with a vortexing mixer at 3000 rpm for 2 min and then centrifuged at 3000 g for 1 min, and the clear, colorless supernatant is discarded. The pellet is redissolved in 2.0 mL of toluene, the slurry is mixed at 3000 rpm for 1 min and centrifuged at 3000 g for 1 min, and the colorless supernatant is discarded. DMF is added to the CdSe NC pellet to prepare the 25 mg/mL CdSe NC dispersion, and the mixture is gently agitated until the NCs are fully dispersed. The SCN-exchanged CdSe NC dispersion is filtered through a 0.2 µm PTFE filter and spincast at 800 rpm for 30 s to form dense, crack-free CdSe NC films on UV-ozone cleaned glass coverslips, double-polished Si substrates, and Pt-coated Si substrates for UV-vis spectroscopy, FTIR spectroscopy and cyclic voltammetry (CV) measurements, respectively, and similarly deposited on the $Al_2O_3$ NC gate insulator layer to construct NC FETs.

Approximately 10-15 nm $Al_2O_3$ NCs dispersed in water are deposited layer-by-layer (LBL) with the polyelectrolytes poly(dimethyldiallyl ammonium chloride) (PDDA) and poly (styrenesulfonate) (PSS). The substrate is first functionalized by spin-coating a bilayer of PDDA and PSS from 2 mg/mL solutions in deionized water (DI) at 1000 rpm for 30 s. After spin-coating the bilayer, a 25 mg/mL dispersion of $Al_2O_3$ NCs is deposited on the functionalized substrate by spin-coating. Then, a 2 mg/mL solution of PSS in deionized water (DI) is dropped onto the $Al_2O_3$ NC coated substrate for 1 min and rinsed in a flow of DI water for 30 s. The substrate is placed on a spinner and spun to remove excess water. The 80 nm gate insulator layer is prepared by depositing 3 layers of a 25 mg/mL $Al_2O_3$ NC dispersion alternately with PSS. Samples for AFM, current-voltage and capacitance-voltage measurements are prepared by LBL assembly of the $Al_2O_3$ NC insulator layers on single-sided polished silicon with 250 nm thermal oxide.

PDDA/PSS Passivation:

Before subsequent photolithographic patterning of source and drain electrodes, PDDA and PSS solutions may be deposited in sequence by drop-casting on the CdSe NC coated substrate, left for 1 min, and rinsed by purging in a DI water flow for 30 s. The substrate is placed on a spinner and spun to remove water.

UV-Visible and Infrared Absorption Spectroscopies:

UV-visible absorption spectra are collected in diffuse reflectance mode on a Cary 5000 Spectrophotometer (formerly Varian Inc., now Agilent Technologies) at 2 nm spectral bandwidth. Films are measured using an integrating sphere accessory (Praying Mantis™, Harrick Scientific). FTIR spectra are collected on a Model 6700 Fourier Transform Infrared (FT-IR) spectrometer (formerly Nicolet, now Thermo-Fisher) with a grazing angle total internal reflectance accessory (GATR, Harrick Scientific) at a spectral resolution of 4 cm-1. The same samples are used for UV-visible and FTIR measurements.

Atomic Force Microscopy (AFM):

AFM is performed in ac mode with an MFP-3D-BIO microscope (Asylum Research Corp.) using an AC240TS silicon cantilever (Olympus). Film thickness and root-mean-square roughness is measured as the average of three identically prepared samples.

Cyclic Voltammetric (CV):

CV measurements are conducted using an Epsilon electrochemical workstation mounted in the nitrogen glovebox. A Pt wire and Ag in 0.01M of $AgNO_3$ in $TBAHF_6$/acetonitrile functioned as the counter and reference electrodes, respectively. CV scans are obtained at a scan rate of 20 mV/s between −1.8 V and 1.8 V relative to the Ag/Ag+ electrode. All the potentials are scaled relative to reference measurements of the redox couple ferrocene/ferrocinium.

Elemental Mapping of Field-Effect Transistors Using Time-of-Flight Secondary Ion Mass Spectrometry (TOF-SIMS):

TOF-SIMS measurements are performed with a TOF-SIMS 5 (ION-TOF GmbH, Munster, Germany) instrument in KBSI Busan center by using a pulsed 30 keV Bi+ primary beam with a current of 1 pA. The analyzed areas used in this work are squares of 100 μm×100 μm and 300 μm×300 μm and the data acquisition time is 100 s.

Positive ion spectra are internally calibrated using H+, H2+, CH3+, C2H5+, C3H7+ peaks and normalized to the respective secondary total ion yields. The chemical images of the analyzed area are recorded with 128×128 pixel resolution during the data acquisition. Charge effects are compensated by means of an interlaced pulsed electron flood gun (Ek=20 eV).

FET Fabrication and Photolithographic Patterning:

Ag NC-based gate electrodes are patterned by standard photolithographic processes using Microposit S1813 photoresist (spun at 4000 rpm for 25 s and baked at 115° C. for 60 s) and a Nanonex NX-2600BA with an exposure energy of 90 mJ/cm². The exposed samples are developed in Microposit MF-319 for 45 s to reveal the gate pattern. Ag NCs are deposited and exchanged using the procedure described above. The patterned Ag NC films are lifted-off in MicroChem Remover-PG. The Ag NC gate electrodes are treated by PDDA/PSS and the $Al_2O_3$ NC gate insulator layer is assembled LBL, the CdSe NC channel is deposited, and the PDDA and PSS passivation layer is deposited as described above. Ag/In source and drain electrodes may be patterned using the same lithographic procedure as described for the Ag NC gate electrodes. The fabricated devices are annealed at temperatures of ~250° C. for 10 min in the nitrogen environment of a glovebox to densify the CdSe NC film and activate In diffusion from the NCs introduced in the source and drain electrodes to complete the all-NC FETs.

Field-Effect Transistor (FET) Characterization:

FET device output and transfer characteristics are collected using a Karl Suss PM5 probe station mounted in a nitrogen glovebox and connected to an Agilent 4156C semiconductor parameter analyzer. Capacitance-voltage characterization is conducted in the nitrogen glovebox using a Model 4192A LF impedance Analyzer (Agilent). The FET electron mobility is calculated from the slope of the square root of the $I_D$-$V_G$ characteristics collected in the saturation regime as $\sqrt{(I_D)}=(V_G-V_T)\sqrt{((WC \mu/2 L)}$ where W is the width and L is the length of the transistor. The unit capacitance C of the gate insulator layer of 0.176 F/cm² is measured using an impedance analyzer.

The capacitance, in combination with the film thickness measured by atomic force microscopy, are used to calculate the dielectric constant, shown in FIG. 3B.

In accordance with one aspect of the invention, colloidal nanocrystal diversity is exploited and materials, interfaces, and processes were designed to construct an all-nanocrystal electronic device using solution-based processes. Metallic silver and semiconducting cadmium selenide nanocrystals are deposited to form high-conductivity and high-mobility thin-film electrodes and channel layers of field-effect transistors. Insulating aluminum oxide nanocrystals are assembled layer by layer with polyelectrolytes to form high-dielectric constant gate insulator layers for low-voltage device operation. Metallic indium nanocrystals are codispersed with silver nanocrystals to integrate an indium supply in the deposited electrodes that serves to passivate and dope the cadmium selenide nanocrystal channel layer. An all-nanocrystal field-effect transistors was fabricated on flexible plastic with electron mobilities of 21.7 square centimeters per volt-second.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for producing an electronic device comprising the steps of:
   forming a first colloidal nanocrystal electronic device element of a first type on a substrate;
   forming a second colloidal nanocrystal electronic device element of a second type on the first colloidal nanocrystal electronic device element; and
   forming a third colloidal nanocrystal electronic device element of a third type on the second colloidal nanocrystal electronic device element;
   wherein the first, second, and third types are different.

2. The method of claim 1, wherein one or more of the first, second, or third nanocrystal electronic device elements is a semiconductor and wherein at least one of the one or more steps of forming the semiconductor electronic device element comprises the steps of:
   forming a base colloidal nanocrystal layer; and
   forming an adjacent colloidal nanocrystal layer configured to dope the base colloidal nanocrystal layer to form the semiconductor.

3. The method of claim 2, wherein the adjacent colloidal nanocrystal layer comprises Indium and the method further comprising:
   annealing the electronic device to supply atomic Indium from the adjacent colloidal nanocrystal layer to dope the base colloidal nanocrystal layer and form a semiconductor channel in the base colloidal nanocrystal layer.

4. The method of claim 1, wherein the first colloidal nanocrystal electronic device element is a metallic electrode, the second colloidal nanocrystal electronic device element is an insulator, and the third colloidal nanocrystal electronic device element is a semiconductor.

5. The method of claim 1, wherein the first colloidal nanocrystal electronic device element is a semiconductor, the second colloidal nanocrystal electronic device element is an insulator, and the third colloidal nanocrystal electronic device element is a metallic electrode.

6. The method of claim 1, further comprising the step of:
   forming a fourth colloidal nanocrystal electronic device element of the first type on the third nanocrystal electronic device element;
   wherein the first and fourth colloidal nanocrystal electronic device elements are metallic electrodes, the second colloidal nanocrystal electronic device element is an insulator, and the third colloidal nanocrystal electronic device element is a semiconductor.

7. A colloidal nanocrystal field effect transistor (FET) comprising:
   a substrate;
   a colloidal nanocrystal gate electrode formed on the substrate;
   a colloidal nanocrystal insulator covering the colloidal nanocrystal gate electrode;
   a colloidal nanocrystal semiconductor formed on the insulator;
   a colloidal nanocrystal source electrode formed on the colloidal nanocrystal semiconductor in a first area; and
   a colloidal nanocrystal drain electrode formed on the colloidal nanocrystal semiconductor in a second area.

8. The FET of claim 7, wherein the colloidal nanocrystal gate electrode comprises Ag nanocrystals, the colloidal nanocrystal insulator comprises $Al_2O_3$ nanocrystals, the colloidal nanocrystal semiconductor comprises $Al_2O_3$ nanocrystals, and the colloidal nanocrystal source and drain electrodes comprise In nanocrystals and Ag nanocrystals.

9. A colloidal nanocrystal electronic device comprising:
a substrate;
a first colloidal nanocrystal electronic device element of a first type formed on the substrate;
a second colloidal nanocrystal electronic device element of a second type formed on the first colloidal nanocrystal electronic device element; and
a third colloidal nanocrystal electronic device element of a third type formed on the second colloidal nanocrystal electronic device element;
wherein the first, second, and third types are different.

10. The device of claim 9, wherein the first colloidal nanocrystal electronic device element is a metallic electrode, the second colloidal nanocrystal electronic device element is an insulator, and the third colloidal nanocrystal electronic device element is a semiconductor.

11. The method of claim 9, wherein the first colloidal nanocrystal electronic device element is a semiconductor, the second colloidal nanocrystal electronic device element is an insulator, and the third colloidal nanocrystal electronic device element is a metallic electrode.

12. The device of claim 9, further comprising:
a fourth colloidal nanocrystal electronic device element formed on the third nanocrystal electronic device element;
wherein the first and fourth colloidal nanocrystal electronic device elements are metallic electrodes, the second colloidal nanocrystal electronic device element is an insulator, and the third colloidal nanocrystal electronic device element is a semiconductor.

* * * * *